(12) United States Patent
Dernier et al.

(10) Patent No.: US 9,596,774 B2
(45) Date of Patent: Mar. 14, 2017

(54) SET-TOP BOX HAVING RUBBER FEET

(75) Inventors: William Phillip Dernier, Indianapolis, IN (US); Mickey Jay Hunt, Camby, IN (US); William Hoffmann Bose, Indianapolis, IN (US)

(73) Assignee: THOMSON LICENSING, Issy les Moulineaux (FR)

(*) Notice: Subject to any disclaimer, the term of this patent is extended or adjusted under 35 U.S.C. 154(b) by 564 days.

(21) Appl. No.: 13/702,701

(22) PCT Filed: Jun. 7, 2011

(86) PCT No.: PCT/US2011/039410
§ 371 (c)(1),
(2), (4) Date: Dec. 7, 2012

(87) PCT Pub. No.: WO2011/156346
PCT Pub. Date: Dec. 15, 2011

(65) Prior Publication Data
US 2013/0088819 A1    Apr. 11, 2013

Related U.S. Application Data

(60) Provisional application No. 61/397,253, filed on Jun. 9, 2010.

(51) Int. Cl.
*H05K 5/02*     (2006.01)
*G06F 1/16*     (2006.01)

(52) U.S. Cl.
CPC ........... *H05K 5/0234* (2013.01); *G06F 1/166* (2013.01); *G06F 1/1656* (2013.01); *H05K 5/0204* (2013.01)

(58) Field of Classification Search
CPC ..................... H05K 5/0234; H05K 5/0204
See application file for complete search history.

(56) References Cited

U.S. PATENT DOCUMENTS 2,391,298 A * 12/1945 Davis .................. F16B 21/086
                                                                411/508
3,093,027 A *  6/1963 Rapata ................ F16B 21/086
                                                                 24/453
(Continued)

FOREIGN PATENT DOCUMENTS

CN          2378983 Y       5/2000
CN         201072516        6/2008
(Continued)

OTHER PUBLICATIONS

Search Report Dated: Jul. 15, 2011.

*Primary Examiner* — Zachary M Pape
*Assistant Examiner* — Douglas Burtner
(74) *Attorney, Agent, or Firm* — Brian Dorini; Jerome G. Schaefer

(57) ABSTRACT

A rubber foot assembly and embossed mounting assembly for supporting a structure is provided that comprise: an aperture formed along a lower wall of the structure and a rubber foot engaged in the aperture, wherein the rubber foot has a flexible contoured bottom portion connected to a top portion through a neck portion. The neck region is adapted to freely slide vertically along a wall of the aperture such that a peripheral region of the flexible contoured bottom portion contacts a portion of the embossed mounting assembly, thereby supporting the structure. A plurality of the rubber foot assemblies and embossed mounting assemblies can be incorporated into the structure, which can be a set-top box, to prevent the structure from rocking on uneven surfaces.

19 Claims, 5 Drawing Sheets

(56) References Cited

U.S. PATENT DOCUMENTS

| | | | | |
|---|---|---|---|---|
| 3,665,800 | A * | 5/1972 | Ryder | F16B 21/086 249/158 |
| 4,396,177 | A * | 8/1983 | Liebl | F16M 11/00 248/188.9 |
| 4,696,089 | A * | 9/1987 | Gjesdal | B25B 13/065 29/235 |
| 4,973,212 | A * | 11/1990 | Jacobs | F16B 5/0642 24/297 |
| 5,007,607 | A * | 4/1991 | Kim | A47B 81/06 248/188.9 |
| 5,400,998 | A * | 3/1995 | Ma | G11B 33/08 248/188.9 |
| 5,957,738 | A * | 9/1999 | Schryer | H01R 11/12 411/533 |
| 2003/0179543 | A1 * | 9/2003 | Sri-Jayantha | G06F 1/1656 361/679.35 |
| 2003/0218957 | A1 * | 11/2003 | Tanishima | H05K 5/0234 720/600 |
| 2004/0068830 | A1 | 4/2004 | Sandeman | |
| 2005/0217879 | A1 * | 10/2005 | Xiong | H05K 5/0234 174/17 CT |
| 2006/0151204 | A1 * | 7/2006 | Yaor | A47B 91/00 174/260 |
| 2007/0082599 | A1 * | 4/2007 | Knight | G11B 33/08 454/184 |
| 2007/0093881 | A1 * | 4/2007 | Germanton | G01G 21/23 607/100 |
| 2008/0302622 | A1 | 12/2008 | Ohtake et al. | |
| 2009/0175001 | A1 * | 7/2009 | Mathew | A47B 91/00 361/679.59 |
| 2011/0051339 | A1 * | 3/2011 | Wang | G06F 1/1656 361/679.02 |
| 2011/0310536 | A1 * | 12/2011 | Uttermann | H05K 5/0234 361/679.01 |
| 2015/0062810 | A1 * | 3/2015 | Ho | H05K 5/0234 361/679.59 |

FOREIGN PATENT DOCUMENTS

| | | |
|---|---|---|
| CN | 101290038 | 10/2008 |
| CN | 201349375 Y | 11/2009 |
| DE | 202005020343 U1 | 3/2006 |
| JP | 5459620 | 10/1952 |
| JP | 3-004596 A | 1/1991 |
| JP | 6029173 | 4/1994 |
| JP | 2001311357 | 11/2001 |
| JP | 2003124641 | 4/2003 |
| JP | 2006121553 | 5/2006 |

* cited by examiner

SET-TOP BOX HAVING RUBBER FEET

CROSS-REFERENCE TO RELATED APPLICATION

This application claims the benefit, under 35 U.S.C. §365 of International Application PCT/US2011/039410, filed Jun. 7, 2011, which was published in accordance with PCT Article 21(2) on Dec. 15, 2011 in English and which claims the benefit of U.S. provisional patent application No. 61/397,253, filed Jun. 9, 2010.

FIELD OF THE INVENTION

The present invention relates to a set-top box having an improved foot design.

BACKGROUND OF THE INVENTION

Set-top boxes continue to be in high demand and an ever increasing need exists to reduce the size and improve aesthetic appeal and stability.

In particular, a stability problem that occurs is rocking of set-top boxes or the like when the devices are placed on surfaces that may be warped or not flat. In fact, in many consumer environments, set-top boxes are moved frequently for various reasons which can include general cleaning, rearrangement of entertainment centers, maintenance, etc. Such frequent moves increase the chance of stability variability, because different surfaces and different locations on a surface can have different contours.

Even though the sizes of set-top boxes and the like have been decreasing, these devices still require four feet for proper load handling and balancing. This requirement for four feet creates the opportunity for rocking, because the contact points of three feet will define a plane and a fourth foot may have a contact point out of tolerance and/or may have a contact point not in the same plane as the other three.

An additional stability problem for a set-top box is damage due to mechanical shocks and vibrations over the device's lifetime. Because the feet of devices are the principal mechanical contact points with the surrounding environment, the characteristics of the feet are paramount in dictating how shock and vibration are transferred to the set-top box.

In light of the above-mentioned stability problems, a need exists for an improved foot design that allows enhanced shock and vibration damping and eliminates the opportunity for device rocking.

SUMMARY OF THE INVENTION

A rubber foot assembly and embossed mounting assembly for supporting a structure is provided that comprises: an aperture formed along a lower wall of the structure and a rubber foot engaged in the aperture, wherein the rubber foot has a contoured bottom portion connected to a top portion through a neck portion. The top portion can be conically shaped and can have a narrow end directed inward and a wide end having shoulder regions directed outward. The top portion can be inserted in the aperture such that the shoulder regions extend past an interior edge of the aperture, thereby locking the rubber foot into the structure. The contoured bottom portion can have a bottom surface for contacting an external support surface and a top surface directed toward the lower wall and connected to the neck region, wherein the top surface has a central region and a peripheral region in which the peripheral region extends from the central region and curves towards the lower wall such that part of the peripheral region contacts an exterior part of the structure.

An electronic device such as a set-top box, computer, server, or the like is also provided that comprises at least one rubber foot and emboss assembly. The device can include a housing having a lower wall; at least one aperture formed along the lower wall; and at least one rubber foot engaged in the at least one aperture, wherein the at least one rubber foot has a contoured bottom portion connected to a top portion through a neck portion and wherein the wide end of the top portion can have a smaller width than a width of the contoured bottom portion. The top portion can be conically shaped and have a narrow end directed inward and a wide end having shoulder regions directed outward. The top portion can be inserted in the aperture such that the shoulder regions extend past an interior edge of the at least one aperture, thereby locking the at least one rubber foot into the housing. The contoured bottom portion, which can be flexible, can further have a bottom surface for contacting an external support surface and a top surface directed toward the lower wall and connected to the neck region, wherein the top surface has a central region and a peripheral region and the peripheral region extends from the central region and curves towards the lower wall such that part of the peripheral region contacts an exterior part of the housing. The at least one rubber foot can have an elongated opening that extends from the neck region and into the top portion, whereby the elongated opening permits the shoulder regions to flex inwardly and pass through the at least one aperture. The contoured bottom portion, the top portion, and the neck portion can each of have a central vertical axis and the central vertical axes that are collinear. The device can further include at least one contoured aperture assembly that extends outwardly from the lower wall to a round peripheral bottom; and a recess within the round peripheral bottom that extends inwardly toward the lower wall to a flat horizontal ledge that surrounds the aperture, wherein the horizontal edge can be lower than the lower wall. The contoured bottom portion can be positioned in the recess such that the peripheral region contacts the horizontal ledge, wherein the horizontal ledge is the above-mentioned exterior part of the housing. In the device, the neck region can be cylindrically shaped and have a vertical height that is greater than a height of a wall that surrounds the aperture, wherein the neck region can be adapted to freely slide vertically along the wall of the aperture while the rubber feet are locked in the lower wall.

BRIEF DESCRIPTION OF THE DRAWINGS

The invention will now be described by way of example with reference to the accompanying figures of which.

DETAILED DESCRIPTION OF THE EMBODIMENTS

The set-top box or the like having the novel stabilizing feet according to the invention can include the various components which are shown in FIG. 1. These components can be a top broad heat sink 10, a main printed circuit board 13, a frame pan 18, and an outer cover 28.

Figure 1A:
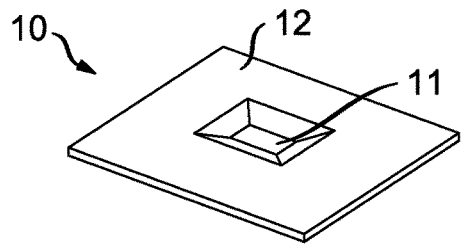
FIG. 1 shows a series of views of the major components of the set-top box according to the invention.

More particularly, FIG. 1A shows a top broad heat sink 10, which is an internal component. The top broad heat sink 10 can be a generally contoured plate that has a generally planar periphery 12 and a contoured central feature such as a pocket, central depression, notch, recess, multilevel depression, mesa extending from and/or into a plane of the planar periphery. The central feature or central depression 11 can have side walls extending from the planar periphery and form an obtuse angle therewith. The contoured feature can have a flat bottom designed to contact the main integrated circuit and/or other heat generating component 17.

Figure 1B:
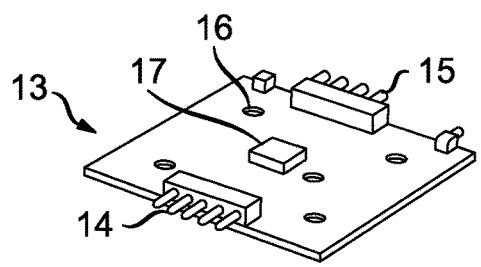

FIG. 1B shows a main printed circuit board 13 or the like, which can be generally flat. The main printed circuit board 13 can have a main integrated circuit 17 or the like in a central region and holes 16 for mounting and/or securing the main printed circuit board 13 to a frame pan 18. Other features of the main printed circuit board are shown in the figure which can include jack panel connectors 15 at one edge and a button cluster 14 at another edge, which can be an opposing edge. The main integrated circuit and other heat generating or hot components 17 can contact the flat bottom or other portion of the central depression 11 of the top broad heat sink 10, which can be in thermal contact with the other heat generating or hot components through a thermal joint which could be a pad.

Figure 1C:
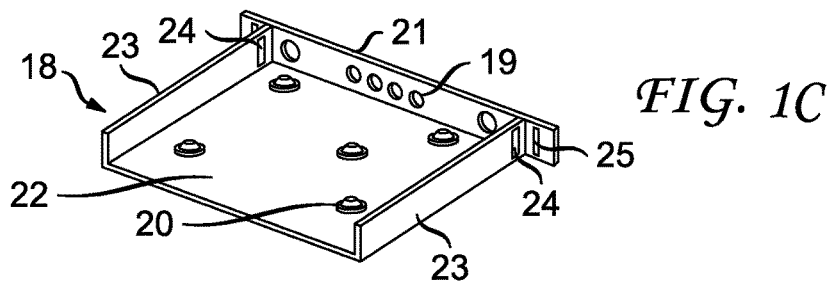

FIG. 1C shows a frame pan 18 which can have a rectangular shape and four sides and which can house the main printed circuit board (pc board) 13. The frame pan 18 has a back wall 21 with jack panel apertures 19 to accommodate jack panel connectors 15 or the like and a base wall or base 22 having embosses 20 for the mounting or securing of the pc board 13 through the holes 16 therein. Additionally, the frame pan can have on the back wall 21 at least one opening 25 therethrough which can be through a portion of the back wall that extends beyond the side walls 23 of the frame pan 18. Additionally, the side walls 23 can have slots therethrough closer to the end of the side walls that are adjacent to the back wall 21. The slots 23 are used to lock the frame pan 18 in the outer cover 28.

Figure 1D:
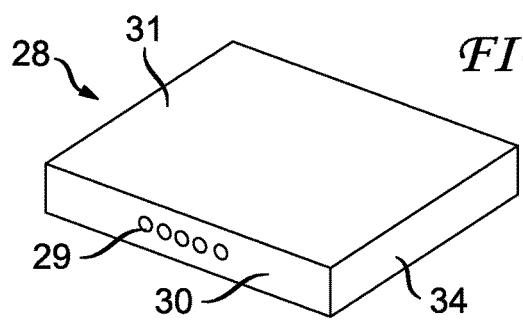
Figure 1E:
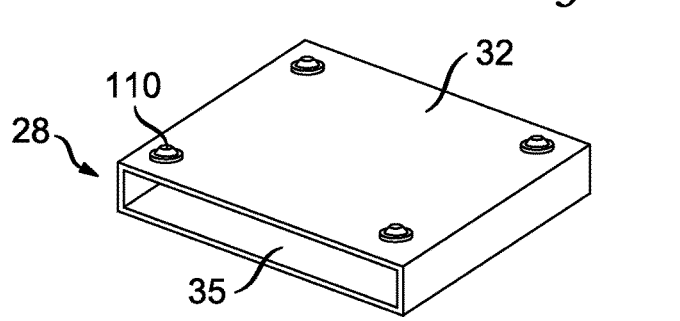

FIGS. 1D and 1E show a housing or an outer cover 28 of the set-top box in an upright position and a rotated upside down position, respectively. The orifices 29 are shown in the front side 30 which can be decorative. The orifices 29 are designed and aligned to accommodate the button cluster 14. The outer cover 28 further includes an upper wall 31, lower wall 32, two outer sides 34, and an open back 35. The exterior side of the lower wall 32 can include rubber feet 110 which can be at least 6 mm in height to ensure adequate air entry under the set-top box for improved thermal management. The assembled internal components of FIGS. 1A-1C are inserted into the outer cover 28 via the open back 35.

Figure 2A:
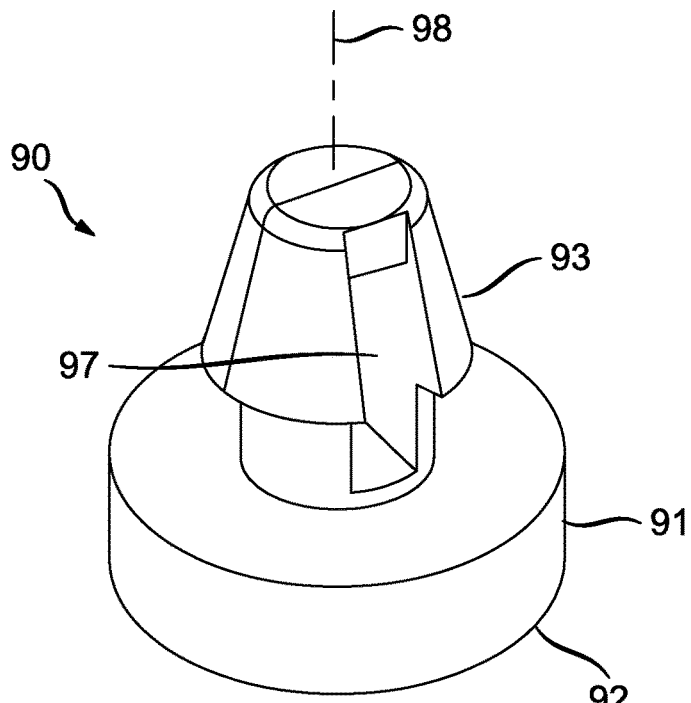
FIG. 2 shows two views of an existing rubber foot design.
Figure 2B:
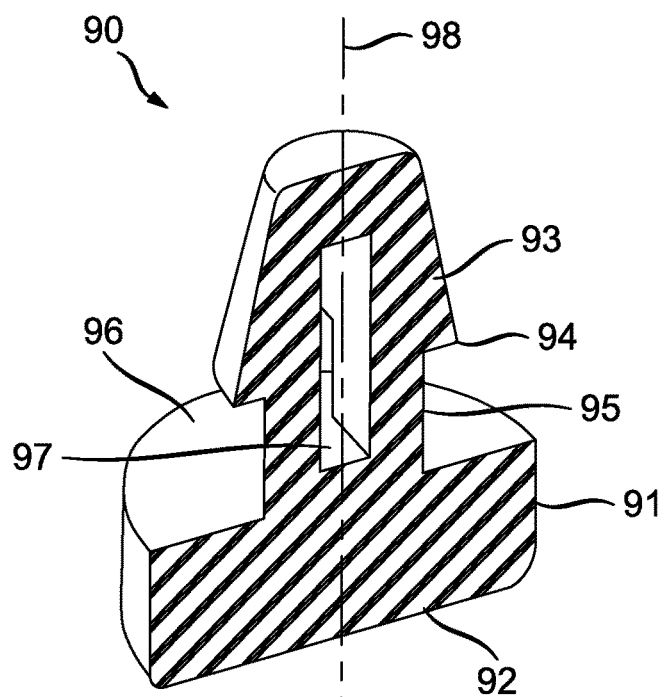

FIGS. 2A and 2B show two views an existing rubber foot design which has been considered and to which improvements were believed to be necessary. FIG. 2A shows a perspective view of the complete existing rubber foot 90 and FIG. 2B shows a perspective view of existing rubber foot 90 cut in half. The existing rubber foot 90 has a bottom portion 91 connected to a top portion 93 through a neck portion 95. The bottom portion 91 is generally cylindrically shaped disk and has a bottom 92 that contacts a surface to which the set-top box will sit. The top portion 93 is conically shaped and has shoulder regions 94 at the wide end of the top portion. It should be understood that the expression "conically shaped" is intended to include a wedge shape or part of cone or a cone segment. Generally, there can be two shoulder regions 94. The neck portion 95 is cylindrically shaped and has a smaller diameter than both the wide end of the top portion 93 and the diameter of the bottom portion 91. The neck portion 95 extends from or is connected to a top surface 96 of the bottom portion 91 and extends to or is connected with the top portion 93 such that the shoulder regions 94 extends away from the neck portion 95. The bottom portion 91, top portion 93, and neck portion 95 each have a central axis 98 that are all aligned with each other. Shown in FIG. 2B is an elongated opening 97 in the existing rubber foot 90 in which the elongated opening 97 is vertically oriented and extends from the top surface 96 of the bottom portion 91 through the neck portion 95 and passed the shoulder regions 94 toward the narrow end of the top portion 93.

Figure 3A:
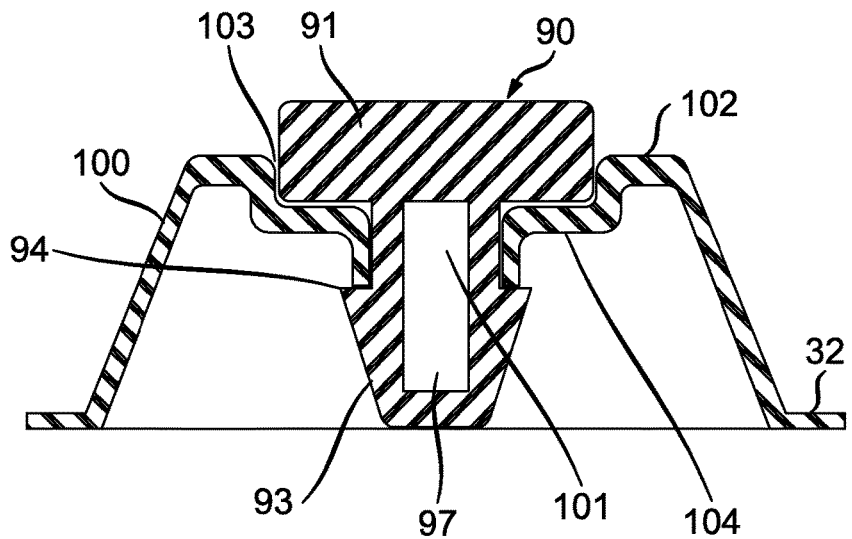
FIG. 3 shows two views of the existing rubber foot design engaged in the set-top box.
Figure 3B:
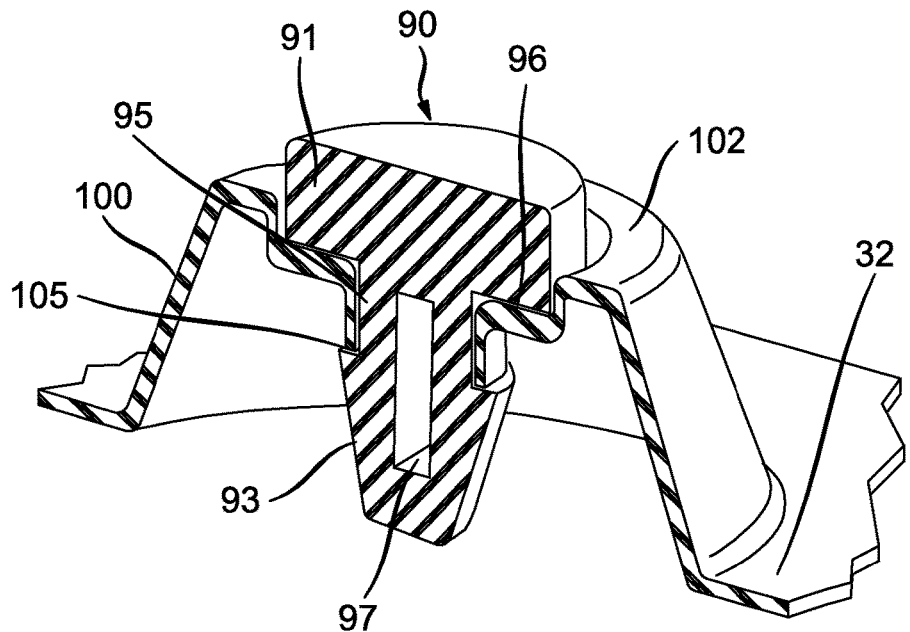

FIGS. 3A and 3B show upside down views of the existing rubber foot 90 inserted in the lower wall 32 of the outer cover 28. FIG. 3A shows a cross section view and FIG. 3B shows a perspective sectional view. The purpose of the elongated opening 97 is to permit both sides the neck portion 95 and the shoulder regions 94 to flex inward to permit top portion 93 of the existing rubber foot 90 to be squeezed into an aperture 101 in a contoured aperture assembly 100 on lower wall 32 of the outer cover 28. The contoured aperture assembly 100 can extend out of the lower wall 32 or protrude therefrom and have a round peripheral bottom 102 in which the round peripheral bottom is round from a plan view perspective of the low wall 32. A recess 103 can be contoured inward from the round peripheral bottom and can have a flat ledge 104 that surrounds the aperture 101 in which the flat edge 104 is parallel to the lower wall 32. As can be seen in FIGS. 3A and 3B, the top portion 93 is fully inserted into the aperture 101 such that the shoulder regions 94 snap past interior edges of the aperture 101 and are in contact with the interior edges 105 of the aperture 101 which is parallel with the flat ledge 104. Concurrently, the top surface 96 of the bottom portion 91 maintains contact with the flat ledge 104, whereby the existing rubber foot 90 is secured in the set-top box and ready for use.

Figure 4A:
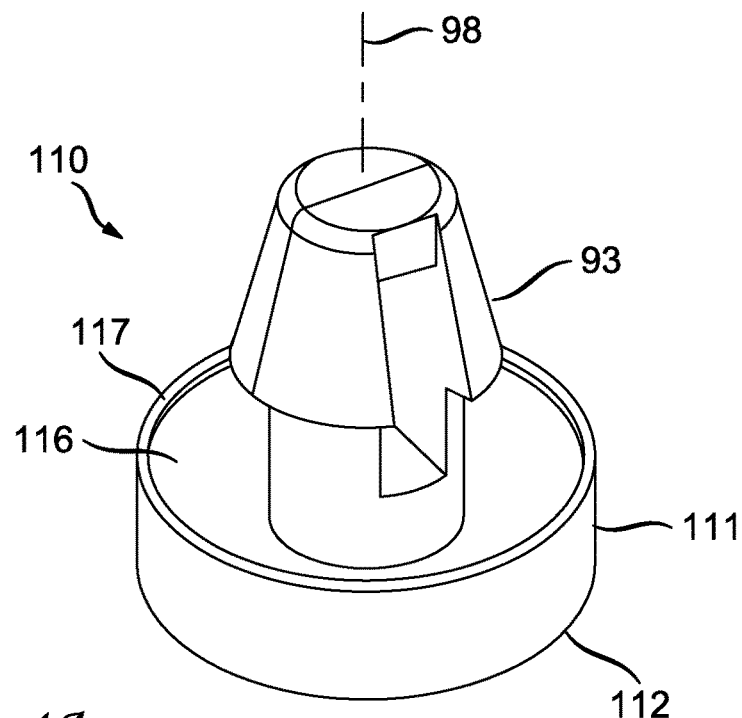
FIG. 4 shows two views of an enhanced rubber foot design.
Figure 4B:
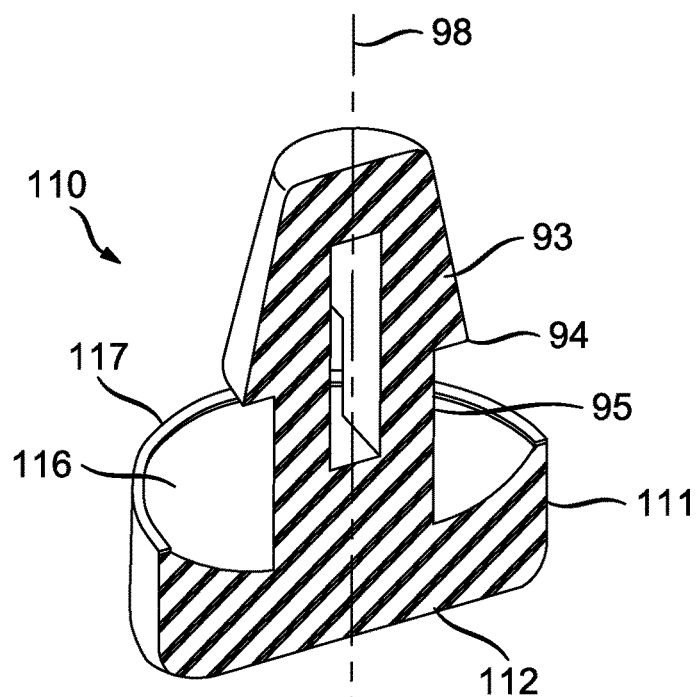

FIGS. 4A and 4B show two views of an enhanced rubber foot 110 is shown. FIG. 4A shows a perspective view of the complete enhanced rubber foot 110 and FIG. 4B shows a perspective view of enhanced rubber foot 110 cut in half. The enhanced rubber foot 110 has a contoured bottom portion 111 connected to a top portion 93 through a neck portion 95. The contoured bottom portion 111 can be flexible, can generally be a concave shaped disk and can have a contoured bottom 112 that contacts a surface to which the set-top box will sit. The top portion 93 is conically shaped and has shoulder regions 94 at the wide end of the top portion. The neck portion 95 is cylindrically shaped and has a smaller diameter than both the wide end of the top portion 93 and the diameter of the contoured bottom portion 111. The neck portion 95 extends from or is connected to a contoured top surface 116 of the contoured bottom portion 111 and extends to or is connected with the top portion 93 such that the shoulder regions 94 extend away from the neck portion 95. The concavity of the contoured bottom 112 and the contoured top surface 116 is such that the peripheral regions of the contoured bottom 112 and the contoured top surface 116 curve inwardly toward the top portion 93. The contoured bottom 112 and contoured top surface 116 can generally be parallel to each other in the sense that they have corresponding surface points that are equidistant to one another in a plan view perspective which can be in a relaxed state. The contoured bottom portion 111, top portion 93, and neck portion 95 each have a central axis 98 that are all aligned with each other. Shown in FIG. 4B is an elongated opening 97 in the enhanced rubber foot 110 in which the elongated opening 97 is vertically oriented and extends from the contoured top surface 116 of the bottom portion 111 or some position thereabove through the neck portion 95 and past the shoulder regions 94 toward the narrow end of the top portion 93.

Figure 5A:
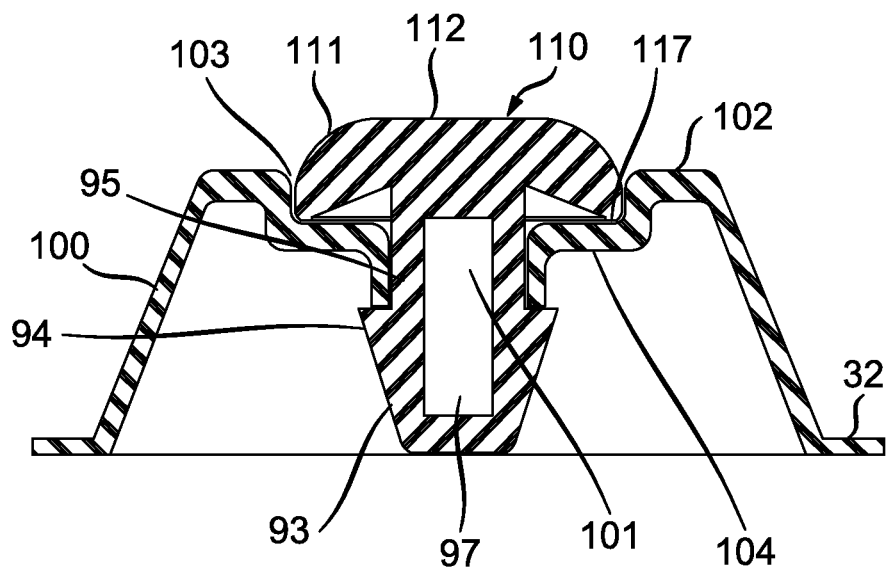
FIG. 5 shows two views of the enhanced rubber foot design engaged in the set-top box.
Figure 5B:
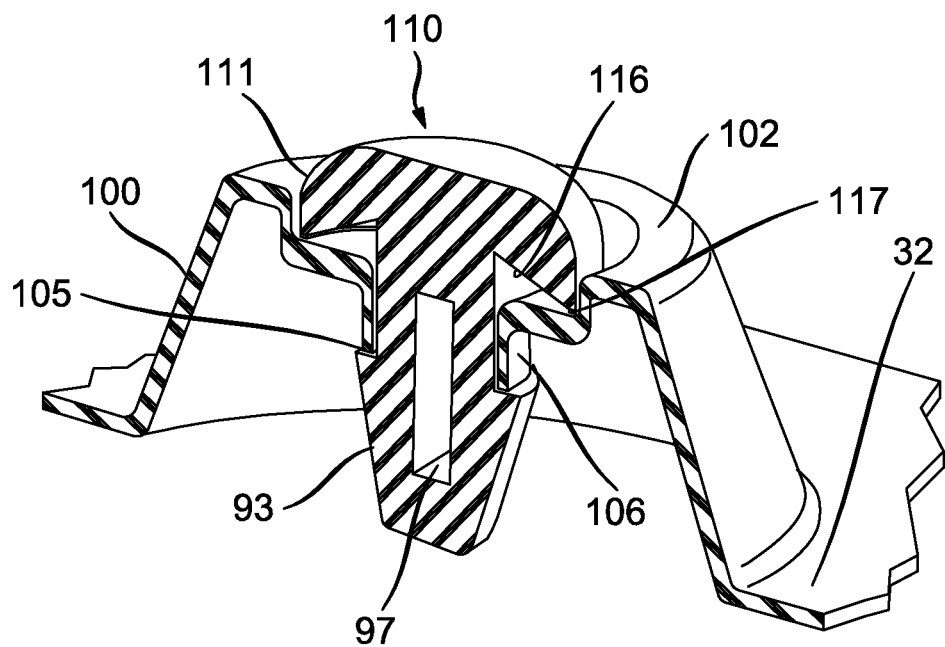

FIGS. 5A and 5B show upside down views of the enhanced rubber foot 110 inserted in the lower wall 32 of the outer cover 28. FIG. 5A shows a cross section view and FIG. 5B shows a perspective sectional view. The purpose of the elongated opening 97 is the same as that mentioned above with regards to the existing rubber foot. The elongated opening 97 permits both sides the neck portion 95 and the shoulder regions 94 to flex inward to permit top portion 93 of the enhanced rubber foot 110 to be squeezed into an aperture 101 in a contoured aperture assembly 100 on lower wall 32 of the outer cover 28. It should be understood that that the elongated opening 97 can go horizontally completely through the rubber foot and the elongated opening 97 can be a U-spaced slot or can be an enclosed hole surrounded by 4 or more sides. The contoured aperture assembly 100 can extend out of the lower wall 32 or protrude therefrom and have a round peripheral bottom 102. A recess 103 can be contoured inward from the round peripheral bottom and can have a flat ledge 104 that surrounds the aperture 101. As can be seen in FIGS. 5A and 5B, the top portion 93 is fully inserted into the aperture 101 such that the shoulder regions 94 snap past interior edges 105 of the aperture 101 and can be in contact with the interior edges of the aperture 101 which is parallel with the flat ledge 104. Concurrently, the contoured top surface 116 of the contoured bottom portion 111 maintains contact with the flat ledge 104, whereby the existing rubber foot 90 is secured in the set-top box and ready for use. In this embodiment, the peripheral region 117 of the contoured top surface 116 contacts the flat ledge 104 such that peripheral region 117 of the contoured top surface 116 is applying a inwardly directed force on the flat ledge 104 toward the top portion 93, thereby causing a central region of the bottom portion 111 to supply an outwardly directed force. In the enhanced rubber foot design the neck region 95 has a vertical height that is substantially greater than a height of the vertical aperture wall 106 that surrounds the aperture 101, which differs from the existing design in which the neck region 95 has a vertical height that is nearly the same as the height of the vertical aperture wall 106 so the top portion 93 and the bottom portion 91 both contact top and bottom surfaces near the vertical aperture wall 106. In the enhanced system, the vertical height relationship advantageously permits of the neck region 95 slide along the vertical aperture wall 106 even after the top portion is snapped in place, thereby allowing the contoured bottom portion 111 to flex or move to final and appropriate position.

In a preferred embodiment there will be 4 enhanced rubber feet 110 in which the load distribution is such that each enhanced rubber foot 110 automatically compresses to levels that cause the set-top box to be balanced, even when the surface upon which the set-top box is placed is not level. Here, the contoured bottom 112 of the contoured bottom portion 111 can have a flat central portion and a curved peripheral portion in which the curved peripheral portion can fit into the recess 103 of the set-top box and is curved toward the set-top box. The curved peripheral portion contacts the set-top box and flexes outward as downward force is applied from the set-top box toward the bottom portion. In the system where 4 or more of the improved rubber feet are used, each of the respective curved peripheral portions are flexed such that the bottom portions move from their resting state toward the set-top box such that the feet are all stable; as such, the set-top does not rock and is supported evenly by all feet, which assist in damping vibrations. The top portion 94 fits into the set-top box through the aperture 101 in the set-top box and the shoulders regions 94 of the top portion 93 can contact an interior part of the set-top box when no downward force is applied and the feet are in their resting state. In use, depending on the external surface that the set-top box will sit, the enhanced rubber feet 110 may be have contoured bottom portions 111 flexed to different extends in which one or more feet may have shoulder regions 94 contacting the interior edges 105 while other feet have shoulder regions 94 not making contact.

It should be understood that although examples of the claimed inventions specifically mention set-top boxes and circuit boards, the invention is not limited to these features. For example, the invention is applicable to computers and other electronic devices having other components.

The invention claimed is:

1. An electronic device comprising:
   a housing having a lower wall;
   at least one aperture formed in the lower wall, said aperture having an internal vertical wall height; and,
   at least one rubber foot engaged in the at least one aperture, the at least one rubber foot comprising:
      a contoured bottom portion connected to a conically shaped top portion through a neck portion, wherein
         the top portion having a narrow end directed inward and a wide end having shoulder regions directed outward,
         the top portion being inserted in the aperture such that the shoulder regions extend past an interior edge of the at least one aperture to lock the at least one rubber foot into the housing,
         the contoured bottom portion has a bottom surface for contacting an external support surface and a contoured top surface directed toward the lower wall and connected to the neck portion,
      the contoured top surface having a central region and a peripheral region, the peripheral region extending from the central region and curving towards the lower wall such that part of the peripheral region contacts an exterior part of the housing,
      the neck portion having a vertical height that is greater than the internal vertical wall height of the aperture, and
      the neck portion is adapted to freely slide vertically along the vertical wall of the aperture while the at least one rubber foot is locked in the lower wall.

2. The electronic device of claim 1, further comprising an elongated opening in the at least one rubber foot that extends from the neck region into the top portion, the elongated opening permitting the shoulder regions to flex inwardly and pass through the at least one aperture.

3. The electronic device of claim 1, wherein the contoured bottom portion, the top portion, and the neck portion each of have a central vertical axis and the central vertical axes are collinear.

4. The electronic device of claim 1, wherein the wide end of the top portion has a smaller width than a width of the contoured bottom portion.

5. The electronic device of claim 1, further comprising: at least one contoured aperture assembly extending outwardly from the lower wall to a round peripheral bottom; and a recess within the round peripheral bottom that extends inwardly toward the lower wall to a flat horizontal ledge that surrounds the aperture.

6. The electronic device of claim 5, wherein the contoured bottom portion is positioned in the recess such that the peripheral region contacts the flat horizontal ledge, the flat horizontal ledge being the exterior part of the housing.

7. The electronic device of claim 6, wherein part of the bottom portion protrudes past the round peripheral bottom.

8. The electronic device of claim 7, wherein the neck portion is cylindrically shaped.

9. The electronic device of claim 8, wherein the peripheral region supplies an upper force on the flat horizontal ledge.

10. The electronic device of claim 9, wherein the electronic device comprises at least four rubber feet.

11. The electronic device of claim 8, wherein the electronic device is a set-top box.

12. The electronic device of claim 11, wherein the round peripheral bottom protrudes to an extent that the lower wall of the set-top box is at least 6 mm from external support surface.

13. The electronic device of claim 1, further comprising:
   at least one contoured aperture assembly that extends outwardly from the lower wall to a peripheral bottom; and
   a recess within the peripheral bottom that extends inwardly toward the lower wall to a flat horizontal ledge that surrounds the aperture.

14. The electronic device of claim 13, wherein the contoured bottom portion is positioned in the recess such that the peripheral region contacts the flat horizontal ledge, the flat horizontal ledge being the exterior part of the housing.

15. The electronic device of claim 14, wherein part of the bottom portion protrudes the peripheral bottom.

16. The electronic device of claim 15, wherein the neck region is cylindrically shaped and has a vertical height that is greater than a height of a wall that surrounds the aperture.

17. The electronic device of claim 16, wherein the peripheral region supplies an upper force on the flat horizontal ledge, the flat horizontal ledge being the exterior part of the lower wall.

18. The electronic device of claim 16, wherein the flat horizontal ledge is lower than the lower wall.

19. A rubber foot assembly and embossed mounting assembly for supporting a structure comprising:
   an aperture formed in a lower wall of the structure, said aperture having an internal vertical wall height; and
   a rubber foot engaged the aperture, the rubber foot comprising
      a contoured bottom portion;
      a neck portion connected to the contoured bottom portion at one end; and
      a conically shaped top portion connected to an opposing end of the neck portion, having a narrow end directed inward and a wide end having shoulder regions directed outward, the top portion being adapted to be inserted in the aperture such that the shoulder regions extend past an interior edge of the aperture, thereby locking the rubber foot into the structure,
   wherein
   the contoured bottom portion further comprises a bottom surface for contacting an external support surface and a top surface directed toward the lower wall and connected to the neck portion,
   the top surface further comprises a central region and a peripheral region, the peripheral region extending from the central region and curving towards the lower wall such that part of the peripheral region contacts an exterior part of the structure,
   the neck portion having a vertical height that is greater than the internal vertical wall height of the aperture, and
   the neck portion is adapted to freely slide vertically along the vertical wall of the aperture while the at least one rubber foot is locked in the lower wall.

* * * * *